United States Patent
Ngai et al.

(10) Patent No.: US 6,556,502 B2
(45) Date of Patent: Apr. 29, 2003

(54) MEMORY CIRCUITRY FOR PROGRAMMABLE LOGIC INTEGRATED CIRCUIT DEVICES

(75) Inventors: Tony Ngai, Campbell, CA (US); Nitin Prasad, Milpitas, CA (US); Thungoc Tran, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/134,886

(22) Filed: Apr. 26, 2002

(65) Prior Publication Data

US 2002/0126562 A1 Sep. 12, 2002

Related U.S. Application Data

(62) Division of application No. 09/703,914, filed on Nov. 1, 2000, now Pat. No. 6,400,635.
(60) Provisional application No. 60/189,677, filed on Mar. 15, 2000.

(51) Int. Cl.$^7$ ................................................. G11C 8/00
(52) U.S. Cl. ............................. 365/230.05; 365/230.03
(58) Field of Search ..................... 365/230.05, 230.06, 365/230.03, 230.01

(56) References Cited

U.S. PATENT DOCUMENTS

| | | | |
|---|---|---|---|
| 3,473,160 A | 10/1969 | Wahlstrom | 340/172.5 |
| 4,875,196 A | * 10/1989 | Spaderna et al. | 365/189.04 |
| 5,010,519 A | 4/1991 | Yoshimoto et al. | 365/149 |
| 5,550,782 A | 8/1996 | Cliff et al. | 365/230.03 |
| 5,559,450 A | 9/1996 | Ngai et al. | 326/40 |
| 5,566,123 A | 10/1996 | Freidin et al. | 365/230.05 |
| 5,590,087 A | 12/1996 | Chung et al. | 365/230.05 |
| 5,689,195 A | 11/1997 | Cliff et al. | 326/41 |
| 5,694,354 A | * 12/1997 | Anami et al. | 365/154 |
| 5,715,197 A | 2/1998 | Nance et al. | 365/189.02 |
| 5,901,079 A | 5/1999 | Chiu et al. | 365/154 |
| 5,933,023 A | 8/1999 | Young | 326/40 |
| 6,011,744 A | 1/2000 | Sample et al. | 365/230.03 |
| 6,020,759 A | 2/2000 | Heile | 326/40 |
| 6,052,327 A | * 4/2000 | Reddy et al. | 365/189.02 |
| 6,144,573 A | 11/2000 | Heile | 365/49 |
| 6,288,970 B1 | 9/2001 | Reddy et al. | 365/230.05 |

OTHER PUBLICATIONS

"Implementing Dual–Port RAM in FLEX 10K Devices," Application Note 65, Altera Corporation, San Jose, CA, Feb. 1996, ver. 1, pp. 1–8.

*1999 Xilinx Data Book*, Xilinx, Inc., San Jose, CA, 1999.

* cited by examiner

*Primary Examiner*—Hoai Ho
(74) *Attorney, Agent, or Firm*—Fish & Neave; Robert R. Jackson; Jeffrey C. Aldridge

(57) ABSTRACT

A programmable logic device includes, in addition to the usual regions of programmable logic and the programmable interconnect, at least one region of memory which has multiple independently usable write and/or read ports (e.g., two write ports and two read ports). Every memory cell in the memory region is accessible from any of these ports. This enables the memory region to be used to provide either one relatively large memory or two somewhat smaller memories, each occupying a fraction of the full memory. In the latter case, the two memories provided can have any of many different sizes relative to one another. Many different modes or combinations of modes of operating the memory region or parts of the memory region are possible.

26 Claims, 5 Drawing Sheets

MEMORY CIRCUITRY FOR PROGRAMMABLE LOGIC INTEGRATED CIRCUIT DEVICES

This application is a divisional of U.S. patent application Ser. No. 09/703,914, filed Nov. 1, 2000, now U.S. Pat. No. 6,400,635 which claims the benefit of U.S. provisional patent application No. 60/189,677, filed Mar. 15, 2000. All of these prior applications are hereby incorporated by reference herein in their entireties.

BACKGROUND OF THE INVENTION

This invention relates to programmable logic integrated circuit devices ("PLDs"), and more particularly to memory circuitry for use on PLDS which a user of the PLD can use for various purposes during normal logic operation of the PLD.

Programmable logic devices having relatively large blocks of memory in addition to the usual programmable logic and programmable interconnect are well known as shown, for example, by Cliff et al. U.S. Pat. No. 5,550,782, Cliff et al. U.S. Pat. No. 5,689,195, Heile U.S. Pat. No. 6,020,759, Heile U.S. Pat. No. 6,144,573, and Heile U.S. Pat. No. 6,453,382. The above-mentioned blocks of memory can be connected to the programmable logic and/or input/output ("I/O") pins of the device via the programmable interconnect. Such blocks of memory can be used for read-only memory ("ROM"), random access memory ("RAM"), content-addressable memory ("CAM"), product-term (p-term) logic, etc. It is known that such blocks of memory can have programmably variable width and depth. For example, a 2 K-bit memory can be configured as 2K one-bit words ("2K×1"), 1K two-bit words ("1K×2"), 512 four-bit words ("512×4"), 256 eight-bit words ("56×8"), 128 16-bit words ("128×16"), etc. It is also known that such blocks of memory can be provided with separate read and write ports so that reading and writing can be done independently at the same time (so-called dual-port operation).

The known programmable logic device memory arrangements of the type described above are sometimes difficult to fully utilize. For example, if a first-in/first-out ("FIFO") memory having a capacity of eight words of eight bits each (i.e., an 8×8 FIFO) is needed, only 64 bits of a 2K bit memory block are used and the remaining 1984 bits in that block are wasted.

SUMMARY OF THE INVENTION

In accordance with this invention a device is provided having programmable circuitry which includes a plurality of logic components, each having at least one programmable circuit, and a memory coupled to the plurality of logic components and being configurable to include at least two write ports and one read port, the memory being capable of performing multiple write and read operations substantially simultaneously.

In an alternative embodiment the memory of the device is configurable to include at least two read ports and one write port.

In still another alternative embodiment the memory of the device is configurable to include two write ports and two read ports.

In each embodiment each memory cell is accessible via any read port and any write port. This allows the memory to be operated in any of several different modes, including (1) operation as one large memory, or (2) operation as two, effectively separate, memories having any of a wide range of relative sizes.

Further features of the invention, its nature and various advantages will be more apparent from the accompanying drawings and the following detailed description.

DETAILED DESCRIPTION

Figure 1:
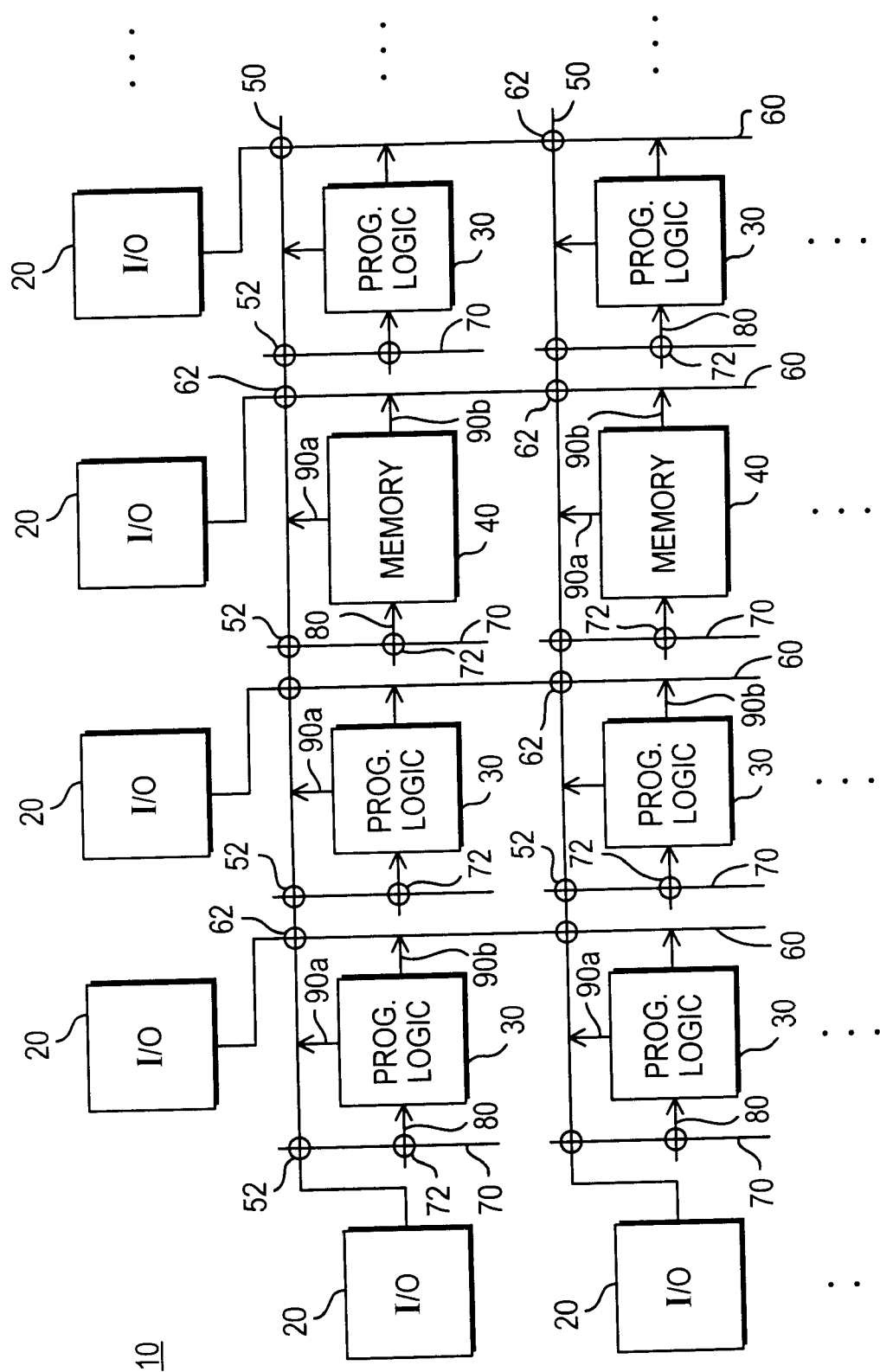
FIG. 1 is a simplified schematic block diagram of an illustrative programmable logic device which can be constructed in accordance with the invention.

As shown in FIG. 1, an illustrative programmable logic device 10, which can be constructed in accordance with this invention, includes a two-dimensional array of intersecting rows and columns of regions 30 of programmable logic. Each row also includes a relatively large region 40 of memory cells. For example, each memory region 40 may include 4K (4096) bits of memory. Memory regions 40 are disposed on device 10 in a column. Regions 20 of input/output circuitry and pads are disposed adjacent each end of each row and column of regions 30/40. Horizontal interconnection conductors 50 are associated with each row of regions 20/30/40. Vertical interconnection conductors 60 are associated with each column of regions 20/30 or 20/40. Region-feeding conductors 70 are associated with each region 30/40 for bringing signals from horizontal conductors 50 to the associated region 30 or 40. Input conductors 80 associated with each region 30 or 40 deliver signals from the associated conductors 70 to that region 30 or 40. Output conductors 90a output signals from each region 30 or 40 to adjacent conductors 50. Output conductors 90b similarly output signals from each region 30 or 40 to adjacent conductors 60. Programmable logic connectors ("PLCs") 52 are provided to selectively interconnect intersecting conductors 50 and 70. PLCs 62 similarly selectively interconnect intersecting conductors 50 and 60, and PLCs 72 similarly selectively interconnect intersecting conductors 70 and 80.

Each of regions 30 is programmable to perform one or more relatively simple logic tasks on signals applied to that region via the associated conductors 80. The output signals that result are output via conductors 90. Very complex logic tasks can be performed by concatenating multiple logic regions 30 via the interconnection resources (e.g., 50, 52, 60, 62, 70, 72, 80, 90) of the device. Signals can be input to or output from device 10 via I/O regions 20.

Memory regions 40 may operate in one or more of several different modes. For example, a memory region 40 may be initially programmed during initial configuration of device 10 and thereafter used as ROM. In such a case, the various locations of the memory region are addressed by address signals on the associated leads 80, and the contents of the addressed locations are output via leads 90 for use elsewhere on device 10 or for outputting from device 10 via one or more I/O regions 20. As another example, a memory region 40 may operate as RAM, storing data applied via associated leads 80 at memory locations determined by "write address" signals on other associated leads 80, and thereafter reading out (via leads 90) data from locations specified by "read address" signals on still other associated leads 80. In either RAM or ROM modes, a memory region 40 may be configured to operate as simple memory, as content-addressable memory ("CAM"), as product-term ("p-term") logic, etc.

It will be understood that FIG. 1 shows only one possible "architecture" of programmable logic devices in which the present invention can be used, and that the invention is equally usable in many other programmable logic device architectures.

Figure 2:
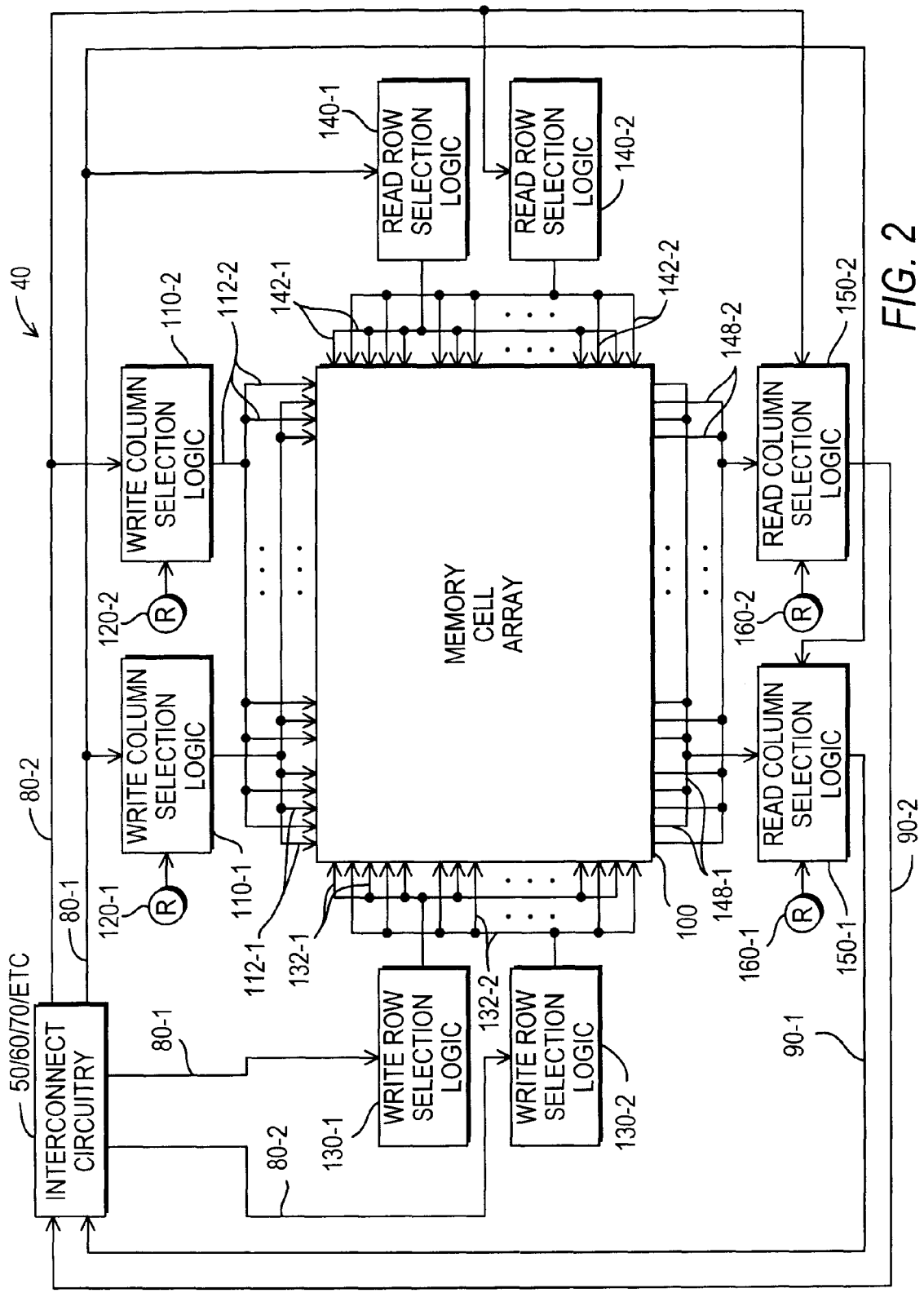
FIG. 2 is a simplified schematic block diagram showing in more detail an illustrative embodiment of a representative portion of the FIG. 1 device in accordance with the invention.
Figure 3:
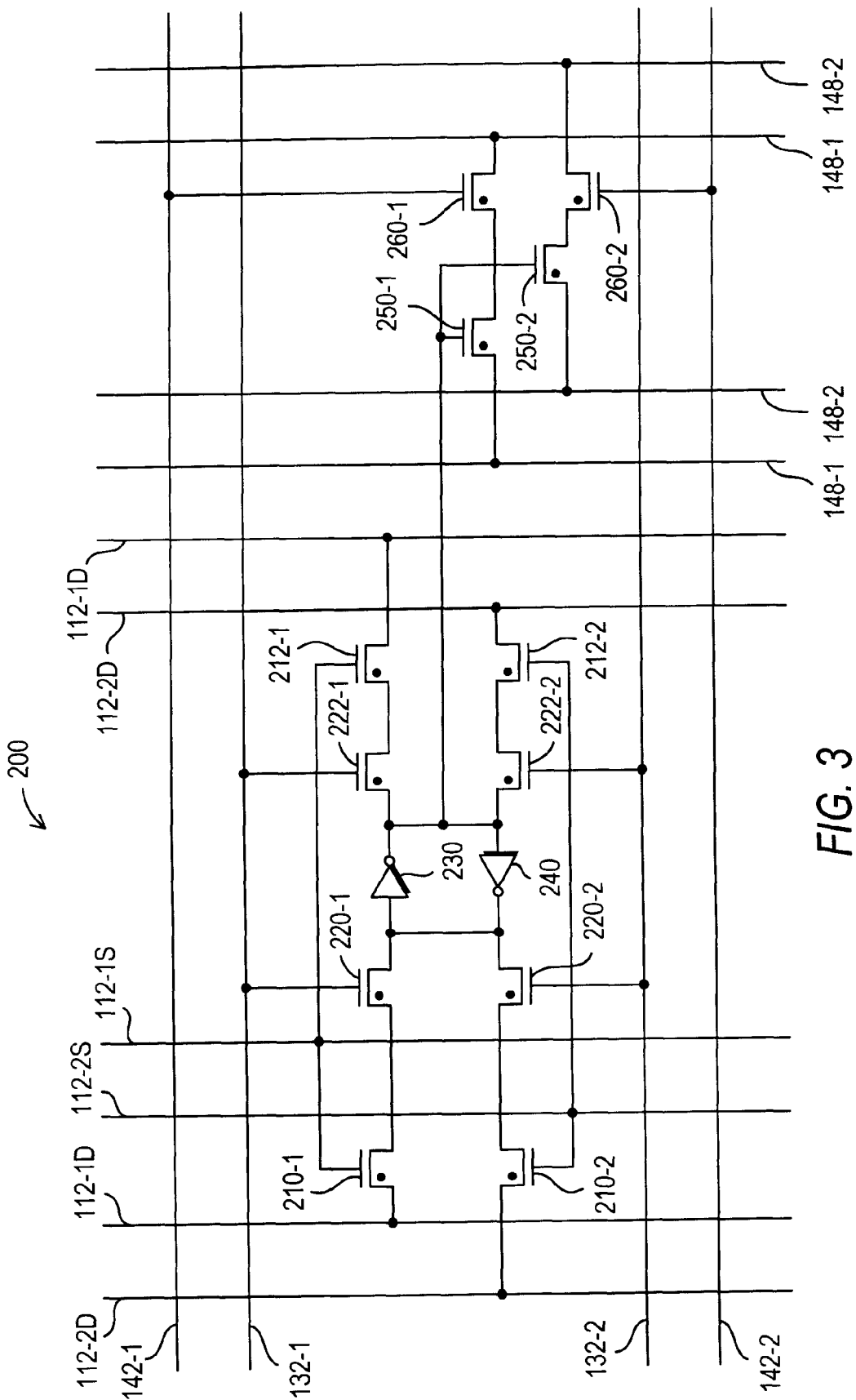
FIG. 3 is a simplified schematic block diagram showing in still more detail an illustrative embodiment of a representative portion of the FIG. 2 circuitry in accordance with the invention.

A representative memory region 40 in accordance with this invention is shown in more detail in FIG. 2. Memory region 40 includes an array 100 of memory cells. (An illustrative embodiment of one representative memory cell 200 is shown in FIG. 3.) For example, array 100 may include 4K bits of memory, and therefore 4K memory cells 200. The memory cells 200 in array 100 are arranged in a two-dimensional array of intersecting rows and columns of such cells. For example, array 100 may include 64 rows and 64 columns of memory cells 200.

Memory region 40 also includes two independent write column selection logic circuits 110-1 and 110-2. Each of write column selection logic circuits 110-1 and 110-2 receives a respective one of two groups of signals 80-1 and 80-2 from the interconnect circuitry 50/60/70/etc. of device 10 (see FIG. 1). Each of write column selection logic circuits 110-1 and 110-2 may also be partly controlled by a respective group of programmable function control elements ("FCEs") 120-1 and 120-2. The signals 80 applied to each of circuits 110 include (1) column address signals which allow the receiving circuit 110 to select which of the columns in array 100 will be selected for writing data also received from that circuit 110, and (2) data signals representing data to be written into the selected columns in array 100. Thus, each instance of reference number 80 typically indicates a bus of several parallel leads (including several parallel address signal leads and, in the case of the buses 80 connected to elements 110, also including several parallel data signal leads). The number of leads in a bus 80 is its width, which is a measure of the capacity of the bus and the associated write port. For example, each bus 80 connected to an element 110 may include 16 parallel leads usable for data, although all of those leads may not be used for data in all cases.

The FCEs 120 associated with each of circuits 110 are programmable to control the width of the data word that circuit 110 applies to array 100. For example, the FCEs 120 associated with each circuit 110 may select any one of several word lengths such as one bit, two bits, four bits, eight bits, or 16 bits. If the four-bit option is selected, then four data signals will be received via the associated bus 80 and passed on by the associated circuit 110. Indeed, each of circuits 110 outputs the received data in multiple parallel instances, i.e., as many instances as are required to apply data to all of the columns of array 100. The column selection signals also output by each circuit 110 make the final selection of the column(s) in array 100 that will actually store the data. For example, if the one-bit option is selected, that one data bit is applied to all 64 columns in array 100, but only one column is enabled to actually store that data bit. If the two-bit option is selected, those two data bits are applied in parallel to each of 32 groups of two columns in array 100, but only one of those 32 groups is actually enabled to store that data. If the four-bit option is selected, those four bits are applied to 16 groups of four columns in array 100, but again only one of those 16 groups is actually enabled to store the data.

The above-described variable width feature allows array 100 to be used to effectively provide memories having any of a wide range of widths and depths such as 4K×1, 2K×2, 1K×4, 512×8, or 256×16, as well as subsets of these depths such as 2K×1, 1K×2, 512×4, or 256×8. If the full capacity of array 100 is not used by one of circuits 110, the remainder of the array is available for use by the other circuit 110. For example, if circuit 110-1 only uses half of array 100 (e.g., to provide a memory which is 2K×1, 1K×2, 512×4, or 256×8), the remainder of array 100 is available for use by circuit 110-2 to effectively provide another independently usable memory (which can again be any of 2K×1, 1K×2, 512×4, or 256×8). The memory sizes indicated in the preceding sentences are only examples, and many other memory sizes are equally possible.

From the foregoing it will be appreciated that the output signals 112 of each of circuits 110 include both column selection and data signals. It will also be appreciated that each of circuits 110 applies such signals to all of the columns in array 100.

Memory region 40 further includes two independent write row selection logic circuits 130-1 and 130-2. Each of write row selection logic circuits 130-1 and 130-2 receives a respective one of two groups of signals 80-1 and 80-2 from interconnect circuitry 50/60/70/etc. The signals 80 applied to each of circuits 130 are row address signals that allow the receiving circuit 130 to select which row in array 100 will write (i.e., store) data received from the respective one of write column selection logic circuits 110. In particular, circuit 130-1 selects the row in array 100 that will store the data applied to array 100 by circuit 110-1 (with column selection also provided by circuit 110-1), and circuit 130-2 selects the row in array 100 that will store the data applied to array 100 by circuit 110-2 (with column selection also provided by circuit 110-2). The row selection output signals of each of circuits 130-1 and 130-2 are applied to all rows of array 100 via leads 132-1 and 132-2, respectively. (For simplicity, the present discussion assumes that each of circuits 130 can select only one row in array 100 at a time. This is the mode of operation used to provide RAM. Later in this specification other modes such as CAM and p-term logic mode will be considered as possible additions to RAM mode.)

Memory region 40 still further includes two independent read row selection logic circuits 140-1 and 140-2. Each of read row selection logic circuits 140-1 and 140-2 receives a respective one of two groups of signals 80-1 and 80-2 from interconnect circuitry 50/60/70/etc. (Although several different circuits (e.g., 110-1, 130-1, 140-1, and 150-1) are shown receiving signals identified by the same reference number (e.g., 80-1), it will be understood that each of these circuits may receive a respective different subplurality of the plurality of signals identified by that reference number.) The signals applied to each of circuits 140-1 and 140-2 are row address signals that allow the receiving circuit 140 to select which row in array 100 will output data to the respectively associated read column selection logic circuit 150-1 and 150-2 (discussed in more detail below). For example, the data in the row selected by the output signals 142-1 of circuit 140-1 are applied via leads 148-1 to circuit 150-1. Similarly, the data in the row selected by the output signals 142-2 of circuit 140-2 are applied via leads 148-2 to circuit 150-2. (Again, for simplicity, the present discussion assumes that each of circuits 140 can select only one row at a time, as is appropriate for basic ROM or RAM operation. Other modes in which each of circuits 140 may select multiple rows in parallel (e.g., to support CAM or p-term logic operations) will be mentioned later in this specification.)

The last major components of memory region 40 are two independent read column selection logic circuits 150-1 and 150-2. In some respects circuits 150 perform a task which is the reverse of the task performed by circuits 120. Each of circuits 150-1 and 150-2 is partly controlled by respective FCEs 160-1 and 160-2 to select any one of several data word lengths similar to those selectable by FCEs 120. In addition, each of circuits 150-1 and 150-2 is further controlled by respective read address signals 80-1 and 80-2 to select which column(s) in array 100 that circuit will output data from. The data output by each of circuits 150-1 and 150-2 are applied to interconnect circuitry 50/60/70/etc. via buses 90-1 and 90-2, respectively. Like the data portion of the buses 80 connected to elements 110, each of buses 90 typically includes several parallel data leads. The number of leads in each bus 90 is the width of the bus and a measure of the capacity of that bus and the associated read port. For example, each bus 90 may include 16 parallel data leads, although all of those leads may not be used in all instances.

As has been mentioned, FIG. 3 shows an illustrative embodiment of one representative memory cell 200 in array 100. The data output signals of circuit 110-1 in FIG. 2 (for the column in array 100 that includes the memory cell 200 shown in FIG. 3) are applied in true and complement form, respectively, to the two conductors 112-1D in FIG. 3 serving (i.e. extending along) that column. Similarly, the column selection output signal of circuit 110-1 for the column that includes depicted memory cell 200 is applied to the conductor 112-1S extending along that column. Similar conductors 112-2D and 112-2S are provided for the data and column selection output signals of circuit 110-2 for the column that includes depicted memory cell 200.

The row selection output signal of circuit 130-1 in FIG. 2 (for the row that includes depicted memory cell 200) is applied to the conductor 132-1 in FIG. 3 that serves (i.e., extends along) that row. Similarly, the row selection output signal of circuit 130-2 for the row that includes depicted memory cell 200 is applied to conductor 132-2 in FIG. 3. The row selection output signal of circuit 140-1 for the row that includes depicted memory cell 200 is applied to conductor 142-1 in FIG. 3, and the corresponding output signal of circuit 140-2 is applied to conductor 142-2 in FIG. 3.

The signals on the two leads 148-1 in FIG. 3 (which leads extend along the entire column that includes depicted memory cell 200) are applied to the portion of circuitry 150-1 in FIG. 2 that serves that column. Similarly, the signals on the two leads 148-2 in FIG. 3 are applied to the portion of circuitry 150-2 that serves that same column.

Data can be written into memory cell 200 by either circuits 110-1 and 130-1 or circuits 110-2 and 130-2. For example, to write data into cell 200 using circuits 110-1 and 130-1, circuit 110-1 applies the data to be written in true and complement form to two leads 112-1D. (It does not matter which lead 112-1D receives the true form of the data and which lead 112-1D receives the complement form of the data, as long as consistent (or at least known) polarity is used.) In addition, circuit 110-1 applies a gate-enabling signal to lead 112-1S and circuit 130-1 applies a gate-enabling signal to lead 132-1. The gate-enabling signals mentioned in the previous sentence turn on all of transistors 210-1, 212-1, 220-1, and 222-1. At least one pair of transistors 210-2/212-2 or 220-2/222-2 are off because circuits 110-2 and 130-2 do not simultaneously select both the same row and column as are being selected by circuits 110-1 and 130-1. Because transistors 210-1, 212-1, 220-1, and 222-1 are all on, inverter 230 is connected between true and complement data signal leads 112-1D. Inverter 230, which is relatively strong as compared to inverter 240, is therefore driven to output the inverse of the data signal on the left-hand one of data leads 112-1D. Inverter 240 is not strong enough to prevent inverter 230 from possibly changing state in response to such external drive, but it is strong enough to hold inverter 230 in whatever state it is in when the external drive is removed. Accordingly, memory cell 200 (principally inverters 230 and 240 connected in a closed (or feedback) loop series) stores the data applied to that memory cell from circuit 110-1.

Alternatively, memory cell 200 can store data from circuit 110-2 with the aid of row selection by circuit 130-2. In this case the data is applied in true and complement form to leads 112-2D. Gate-enabling signals are applied to leads 112-2S and 132-2. These gate-enabling signals enable all of transistors 210-2, 212-2, 220-2, and 222-2. At least one pair of transistors 210-1/212-1 or 220-1/222-1 is concurrently disabled by the signals from circuits 110-1 and 130-1. Enabling all of transistors 210-2, 212-2, 220-2, and 222-2 connects inverter 230 between leads 112-2D, which allows inverter pair 230 and 240 to receive and store the data output by circuit 110-2.

The data stored in memory cell 200 can be read out to either or both of circuits 150-1 and 150-2 by use of circuits 140-1 and/or 140-2. For example, to read the data out to circuit 150-1, circuit 140-1 applies a gate-enabling signal to lead 142-1. This turns on transistor 260-1 in FIG. 3. If the output signal of inverter 230 is also a gate-enabling signal (assumed to be logic 1), transistor 250-1 is also turned on. With both of transistors 250-1 and 260-1 on, a short circuit is created between leads 148-1 (normally driven or biased to respective different signal levels or potentials). This short circuit condition is detected by circuit 150-1 as an indication that memory cell 200 is outputting logic 1. If the output signal of inverter 230 is of the opposite polarity (assumed to be logic 0), transistor 250-1 is not turned on, leads 148-1 are not short-circuited to one another, and circuit 150-1 detects this as an indication that memory cell 200 is outputting logic 0.

To read memory cell 200 out to circuit 150-2, circuit 140-2 applies a gate-enabling signal to lead 142-2. This turns on transistor 260-2. If the output signal of inverter 230 is also a gate-enabling signal, transistor 250-2 is also turned on. This completes a short circuit between leads 148-2 (normally driven or biased to respective different signal levels or potentials). This short circuit condition is detected by circuit 150-2 as an indication that memory cell 200 is outputting logic 1. On the other hand, if inverter 230 is outputting logic 0, transistor 250-2 is not turned on, leads 148-2 are not short circuited, and circuit 150-2 detects this as an indication that memory cell 200 is outputting logic 0.

It will be noted that whereas a particular memory cell 200 can only be written to by either circuits 110-1/130-1 or circuits 110-2/130-2 at any given time, any memory cell 200 can be simultaneously read by both of circuits 140-1/150-1 and circuits 140-2/150-2 if desired.

Because all columns and all rows of memory cell array 100 are available to both circuits 110-1/130-1/140-1/150-1 and circuits 110-2/130-2/140-2/150-2, utilization of the capacity of array 100 can be allocated in many different ways between these two circuit groups. The allocation is controlled by the programming of FCEs 120 and 160 and by the manner in which array 100 is addressed via circuits 110, 130, 140, and 150.

In addition to more flexible allocation of the capacity of memory cell array 100, the circuitry shown and described herein allows the memory to be used in any of several different ways such as the following:

1. Quad-port memory with two write ports and two read ports;
2. Tri-port memory with two write ports and one read port or one write port and two read ports;
3. True dual-port memory with two ports capable of both read and write;
4. Two independent original dual-port memories with one write port and one read port;
5. Two independent single-port memories with one port capable of both read and write; and
6. Two independent ROMs.

Figure 4:
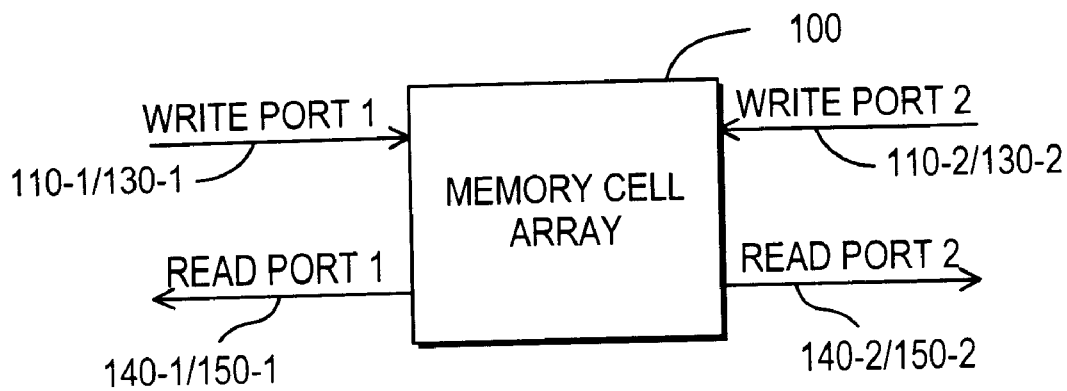
FIG. 4 is a more simplified representation of the circuitry shown in FIG. 2.

The memory circuitry shown and described herein may thus be thought of as including up to four ports, i.e., two write ports (including circuits 110-1/130-1 and circuits 110-2/130-2) and two read ports (including circuits 140-1/150-1 and circuits 140-2/150-2). The quad-port operation mentioned in the immediately preceding list is the only listed mode that uses all four of these ports independently. The other modes listed above are implemented by tying together various ones of the ports. FIG. 4 shows memory cell array 100 with read and write circuitry 110/130/140/150 abstracted to the four "ports" mentioned above.

Figure 5:
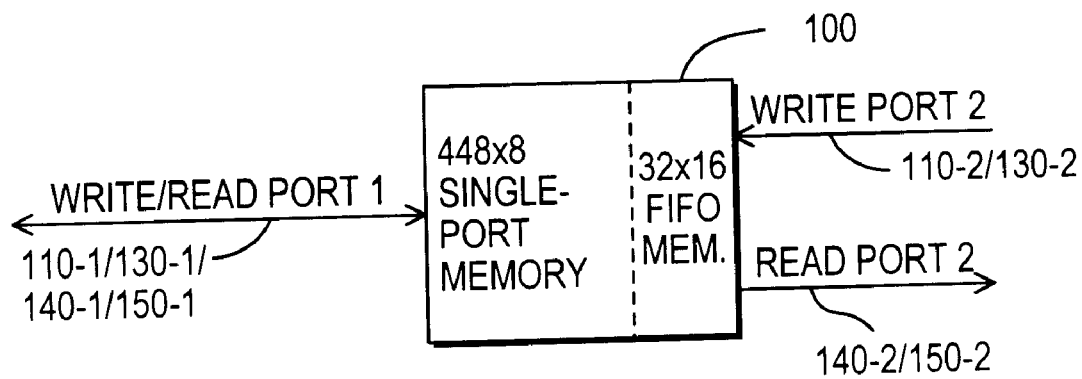
FIG. 5 is similar to FIG. 4, but illustrates a particular use of the FIG. 4 circuitry in accordance with the invention.

The aspect ratio for each of the abovementioned ports can be independently configured. For example, assuming that the total capacity of memory cell array 100 is 4K bits, each port can be independently configured to 4K×1, 2K×2, 1K×4, 512×8, or 256×16 when operating as a single block. Alternatively, if array 100 is used as two wholly or partly independent memory blocks, each port can be independently configured to various subsets of the above possibilities such as 2K×1, 1K×2, 512×4, 256×8, or 128×16. The boundary between any such two independently usable portions of array 100 is effectively movable such that one portion can be bigger than the other. For example, array 100 can accommodate two independent 256×8 portions or one 448×8 portion and one 32×16 portion. In the latter case, rows 1–56 are used to implement 448×8, and rows 57–64 are used to implement 32×16. Moreover, the two portions can operate in different modes as described. As an example, the 448×8 portion can be a single-port memory, while the 32×16 portion can be a first-in/first-out ("FIFO") memory. FIG. 5 illustrates this last example.

With the above-described movable boundary between two usable portions of memory cell array 100, it is readily possible to have output bus width which is not an integer power of two. For example, a 455×9 memory can be implemented in a 4K array 100. This can be done as follows: Rows 1–56 are used by a first port to implement 448×8. Rows 58–64 are used by the second port to implement 448×1. This leaves row 57 to be shared by the two ports to implement the last 7×8 for the first port and 1×8 for the second port with one spare bit. Without the above-described quad-port capability, only a 256×9 memory can be implemented in a 4K dual-port array.

The example discussed in the immediately preceding paragraph is an illustration of the point that the two write ports and/or the two read ports can be tied or operated together (i.e., in parallel) to effectively provide write and/or read ports having different widths than are normally associated with (or in some cases even possible) using only one or the other of the two write and read ports. To still further illustrate this point, if the maximum width of each separate write or read port is 16 bits (e.g., because each bus 80/90 connected to an element 110/150 has a maximum of 16 parallel data leads, and because each element 110/150 has a maximum "×16" option), it is nevertheless possible to do parallel writing and/or reading of words longer than 16 bits (e.g., 20 bits, 24 bits, or up to 32 bits). For example, to write 32 bits in parallel, both elements 110 are programmed (using the associated FCEs 120) to "×16" mode. Half of the 32 bits to be written in parallel are applied to element 110-1 via bus 80-1, while the other half of those 32 bits are applied to element 110-2 via bus 80-2. Of course, the address signals applied to elements 110-1/130-1 differ sufficiently from the address signals applied to elements 110-2/130-2 so that the 32 bits are all written in different memory cells in array 100. To continue with the 32-bit example, to read 32 bits in parallel, both elements 150 are programmed (using FCEs 160) to "×16" mode. Using sufficiently different address signals applied to elements 140-1/150-1, on the one hand, and elements 140-2/150-2, on the other hand, 16 bits are read out of array 100 via element 150-1 and bus 90-1, and (in parallel) another 16 bits are read out of array 100 via element 150-2 and bus 90-2. By effectively combining two write ports and/or two read ports in the manner illustrated by this example, wider write and/or read ports (i.e., ports with greater capacity) can be provided.

Figure 6:
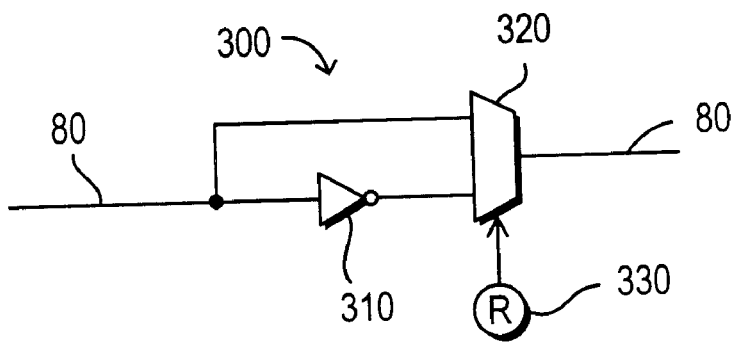
FIG. 6 is a simplified schematic block diagram of an illustrative embodiment of representative circuitry that can be used in the circuitry of the other FIGURES in accordance with the invention.

To facilitate use of two memory portions without conflict, all inputs 80 to memory region 40 (or at least all address signal inputs) can be equipped with programmable inversion, e.g., using programmable inversion circuitry 300 like that shown in FIG. 6. In FIG. 6 the signal on an incoming lead 80 (on the left) is applied directly to one input terminal of PLC 320 (e.g., a multiplexer). The incoming signal is also applied to the other input terminal of PLC 320 via inverter 310. PLC 320 is programmable by FCE 330 to output either one of its two input signals via outgoing lead 80 (on the right). Accordingly, the outgoing lead 80 signal can be either the true or the complement version of the incoming lead 80 signal. With the provision of such programmable inversion, no external address offsetting is required to resolve address-space conflict between two ports. For example, both ports can count up from least significant bit ("LSB") externally, but the second port's address bus is inverted such that the second port will count down from the most significant bit ("MSB") address. As long as the total memory space is less than or equal to 4K bits, there will be no conflict between the two memories.

With regard to ROM operation, it should be noted that in addition to circuits 110 and 130 for RAM programming of memory cell array 100 during normal logic operation of device 10, all of device 10 (including array 100) is programmable in the conventional way by conventional circuitry that is not shown in any of the Figures during initial configuration of the device. In the typical use of array 100 as ROM, the ROM data is stored in array 100 during that initial configuration of device 10. Thereafter, during normal logic operation of device 10, the ROM data can be read out of array 100 using circuits 140 and 150 as described earlier in this specification for RAM data. In other words, except for the data being ROM data and therefore not being changed by making use of the write ports, ROM operation can have the same flexibility as is described above for RAM operation (specifically RAM reading).

Memory region 40 can also be equipped to support modes of operation other than the above-described RAM and ROM modes. For example, memory region 40 can also be equipped to provide p-term logic (as shown, for example, in Heile U.S. Pat. No. 6,020,759) and/or content addressable memory ("CAM") (as shown, for example, in Heile U.S. Pat. No. 6,144,573, and Heile U.S. Pat. No. 6,453,382). To avoid undue complication of the circuitry, other modes such as p-term and CAM preferably do not use the true quad-port capability of memory region 40. Instead, in these other modes memory region 40 is operated as two independent 2K bit memory blocks with no effectively movable boundary between those two blocks.

Figure 7:
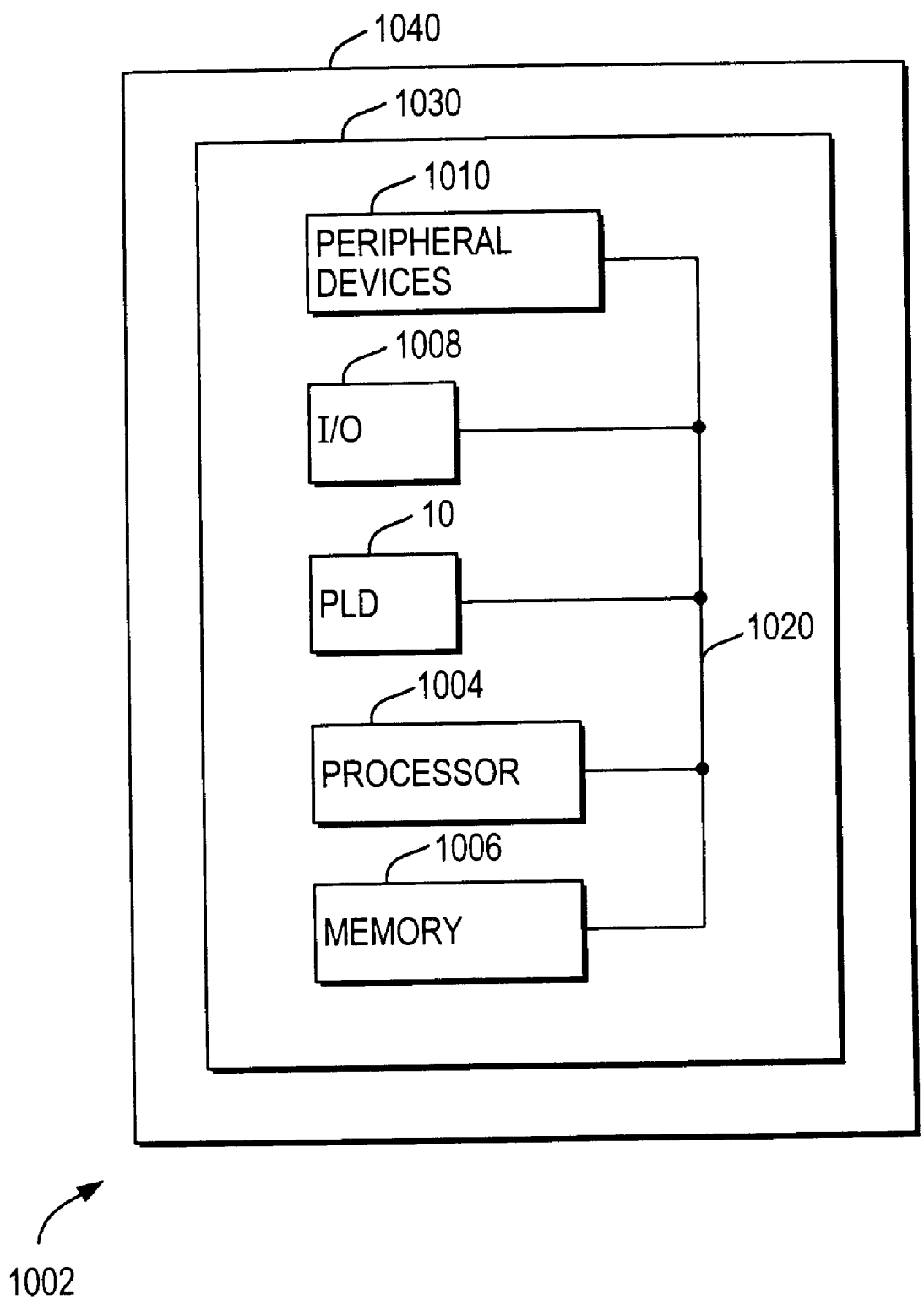
FIG. 7 is a simplified block diagram of an illustrative system employing a programmable logic device in accordance with the invention.

FIG. 7 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of this invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the numbers of the various types of interconnection conductors, the numbers and sizes of the PLCs provided for making interconnections between various types of interconnection conductors, etc. It will also be understood that various directional and orientational terms such as "vertical" and "horizontal," "left" and "right," "above" and "below," "row" and "column," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. If two write ports will not be needed, then the circuitry for one of the two write ports can be omitted, if desired. Alternatively, if two read ports will not be needed, then the circuitry for one of the two read ports can be omitted if desired.

What is claimed is:

1. A programmable logic integrated circuit device comprising:
a plurality of regions of programmable logic;
a region of memory including a plurality of memory cells, first write circuits and second write circuits each of which is configured to selectively write data to any of the memory cells, and first read circuits and second read circuits each of which is configured to selectively read data from any of the memory cells; and
programmable interconnect circuitry configured to selectively convey signals to, from, and between the regions of programmable logic and memory.

2. The device defined in claim 1 wherein each of the first write circuits and second write circuits includes true and complement conductors for conveying data to be written into a memory cell in true and complement form, respectively.

3. The device defined in claim 2 wherein each of the first write circuits and second write circuits further includes switching circuitry configured to selectively connect a memory cell that is to receive the data on the true and complement conductors of the associated write circuits in series between those true and complement conductors.

4. The device defined in claim 3 wherein the switching circuitry comprises first and second switches associated with each of the memory cells, each memory cell being connected in series between the first and second switches associated with that memory cell, and each memory cell and its associated first and second switches being connected in series between the true and complement conductors.

5. The device defined in claim 4 wherein the first and second switches associated with each of the memory cells are controlled in parallel.

6. The device defined in claim 1 wherein each of the first read circuits and second read circuits includes first and second conductors that are respectively biased to different first and second potentials.

7. The device defined in claim 6 wherein each of the first read circuits and second read circuits further includes switching circuitry associated with each of the memory cells and configured to selectively produce a short circuit connection between the first and second conductors in response to the data in that memory cell and selection of that memory cell as the memory cell to be read.

8. The device defined in claim 7 wherein the switching circuitry comprises first and second switches associated with each of the memory cells and connected in series with one another between the first and second conductors, the first switch being controlled by the associated memory cell and the second switch being enabled by the associated read circuits when that memory cell is to be read.

9. A digital processing system comprising:
processing circuitry;
a memory coupled to said processing circuitry; and
a programmable logic integrated circuit device as defined in claim 1 coupled to the processing circuitry and the memory.

10. A printed circuit board on which is mounted a programmable logic integrated circuit device as defined in claim 1.

11. The printed circuit board defined in claim 10 further comprising:
a memory mounted on the printed circuit board and coupled to the programmable logic integrated circuit device.

12. The printed circuit board defined in claim 10 further comprising:
processing circuitry mounted on the printed circuit board and coupled to the programmable logic integrated circuit device.

13. A programmable logic integrated circuit device comprising:
a plurality of regions of programmable logic;
a region of memory including a plurality of memory cells, first and second write circuits each of which is configured to selectively write data to any of the memory cells, and first and second read circuits each of which is configured to selectively read data from any of the memory cells; and
programmable interconnect circuitry configured to selectively convey signals to, from, and between the regions of programmable logic and memory, wherein the memory cells are organized in a plurality of intersecting rows and columns of such cells, and wherein each of the write circuits includes:
column selection circuitry configured to select any one of the columns to receive data; and
row selection circuitry configured to select any one of the rows to receive data, concurrent selection of a row and column causing the memory cell at the intersection of that row and column to store data supplied by the write circuit.

14. The device defined in claim 13 wherein the column and row selection circuitries of each of the write circuits are substantially separate from the column and row selection circuitries of the other write circuit.

15. The device defined in claim 13 wherein the column and row selection circuitries of each of the write circuits have connections to the interconnect circuitry that are substantially separate from the connections to the interconnect circuitry of the column and row selection circuitries of the other write circuit.

16. A programmable logic integrated circuit device comprising:
a plurality of regions of programmable logic;
a region of memory including a plurality of memory cells, first and second write circuits each of which is configured to selectively write data to any of the memory cells, and first and second read circuits each of which is configured to selectively read data from any of the memory cells; and
programmable interconnect circuitry configured to selectively convey signals to, from, and between the regions of programmable logic and memory, wherein the memory cells are organized in a plurality of intersecting rows and columns of such cells, and wherein each of the read circuits includes:
row selection circuitry configured to select any one of the rows as the row from which data will be read; and
column selection circuitry configured to select any one of the columns as the column from which data will be read, concurrent selection of a row and column causing data to be read from the memory cell at the intersection of that row and column.

17. The device defined in claim 16 wherein the row and column selection circuitries of each of the read circuits are substantially separate from the row and column selection circuitries of the other read circuit.

18. The device defined in claim 17 wherein the row and column selection circuitries of each of the read circuits have connections to the interconnect circuitry that are substantially separate from the connections to the interconnect circuitry of the row and column selection circuitries of the other read circuit.

19. A programmable logic device comprising:
a plurality of regions of programmable logic;
a region of memory including a plurality of memory cells, first read ports configurable to selectively read data from any of the memory cells, and first write ports and second write ports each of which is configurable to selectively write data to any of the memory cells and at least one of which is equipped with programmable inversion; and
programmable interconnect circuitry configured to selectively convey signals to, from, and between the regions of programmable logic and memory.

20. A programmable logic device comprising:
a plurality of regions of programmable logic;
a region of memory including a plurality of memory cells, a read port which is configurable to selectively read data from any of the memory cells, and first and second write ports each of which is configurable to selectively write data to any of the memory cells and at least one of which is equipped with programmable inversion; and
programmable interconnect circuitry configured to selectively convey signals to, from, and between the regions of programmable logic and memory, wherein the memory cells are organized in a plurality of intersecting rows and columns of such cells, and wherein each of the write ports includes:
column selection circuitry which is configurable to select at least one of the columns to receive data; and
row selection circuitry which is configurable to select at least one of the rows to receive data, concurrent selection of a row and column causing the memory cell at the intersection of that row and column to store data supplied by the write port.

21. The device defined in claim 20 wherein the column and row selection circuitries of each of the write ports are substantially separate from the column and row selection circuitries of the other write port.

22. The device defined in claim 20 wherein the column and row selection circuitries of each of the write ports have connections to the interconnect circuitry that are substantially separate from the connections to the interconnect circuitry of the column and row selection circuitries of the other write port.

23. A programmable logic device comprising:

a plurality of regions of programmable logic;

a region of memory including a Plurality of memory cells, first write ports configurable to selectively write data to any of the memory cells, and first read ports and second read ports each of which is configurable to selectively read data from any of the memory cells and at least one of which is equipped with programmable inversion; and programmable interconnect circuitry configured to selectively convey signals to, from, and between the regions of programmable logic and memory.

24. The device defined in claim 23 wherein each of the first read ports and second read ports includes first and second conductors that are respectively biased to different first and second potentials.

25. The device defined in claim 24 wherein each of the first read ports and second read ports further includes switching circuitry associated with each of the memory cells and configured to selectively produce a short circuit connection between the first and second conductors in response to the data in that memory cell and selection of that memory cell as the memory cell to be read.

26. A programmable logic device comprising:

a plurality of regions of programmable logic;

a region of memory including a plurality of memory cells, a write port which is configurable to selectively write data to any of the memory cells, and first and second read ports each of which is configurable to selectively read data from any of the memory cells and at least one of which is equipped with programmable inversion; and programmable interconnect circuitry configured to selectively convey signals to, from, and between the regions of programmable logic and memory, wherein the memory cells are organized in a plurality of intersecting rows and columns of such cells, and wherein each of the read ports includes:

row selection circuitry which is configurable to select at least one of the rows as the row from which data will be read; and column selection circuitry which is configurable to select at least one of the columns as the column from which data will be read, concurrent selection of a row and column causing data to be read from the memory cell at the intersection of that row and column by the read port.

* * * * *